(12) United States Patent
Lee (10) Patent No.: US 9,576,681 B2
(45) Date of Patent: *Feb. 21, 2017

(54) SEMICONDUCTOR DEVICE HAVING HIGH-VOLTAGE TRANSISTOR

(71) Applicant: SK hynix Inc., Gyeonggi-do (KR)

(72) Inventor: Dong Hwan Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/138,998

(22) Filed: Apr. 26, 2016

(65) Prior Publication Data

US 2016/0240232 A1    Aug. 18, 2016

Related U.S. Application Data

(63) Continuation-in-part of application No. 13/602,887, filed on Sep. 4, 2012, now Pat. No. 9,330,739.

(30) Foreign Application Priority Data

Dec. 22, 2011   (KR) .......................... 10-2011-0139986

(51) Int. Cl.
| | |
|---|---|
| *G11C 16/04* | (2006.01) |
| *G11C 11/00* | (2006.01) |
| *G11C 7/00* | (2006.01) |
| *G11C 29/44* | (2006.01) |
| *G11C 7/18* | (2006.01) |
| *H01L 27/02* | (2006.01) |
| *H01L 27/105* | (2006.01) |
| *G11C 16/34* | (2006.01) |
| *G11C 29/42* | (2006.01) |
| *G11C 29/52* | (2006.01) |

(Continued)

(52) U.S. Cl.
CPC ................ *G11C 29/44* (2013.01); *G11C 7/18* (2013.01); *G11C 16/3454* (2013.01); *G11C 29/42* (2013.01); *G11C 29/52* (2013.01); *H01L 27/0207* (2013.01); *H01L 27/105* (2013.01); *H01L 27/1052* (2013.01); *G11C 16/0483* (2013.01); *G11C 2029/0411* (2013.01); *H01L 27/10885* (2013.01)

(58) Field of Classification Search
CPC ..... G11C 16/04; G11C 16/0483; G11C 16/10; G11C 11/5628; G11C 16/26; G11C 8/06; G11C 16/08; G11C 16/14; G11C 16/24; G11C 2211/5621; G11C 16/344
See application file for complete search history.

(56) References Cited

U.S. PATENT DOCUMENTS 9,330,739 B2 *  5/2016  Lee ........................... G11C 7/18

* cited by examiner

*Primary Examiner* — Hien Nguyen (74) *Attorney, Agent, or Firm* — IP & T Group LLP (57) ABSTRACT

A semiconductor device includes a semiconductor device, comprising a memory cell array including a plurality of memory cells connected to a first bit line and a second bit line, respectively, a page buffer group, and bit line selection circuits including a plurality of selection circuit blocks to connect the first bit lines or the second bit lines to the page buffer group, wherein each of the selection circuit blocks includes a first contact region and a second contact region to which the first and second bit lines coupled, and same bit lines of the first and second bit lines are coupled to contact regions adjacent to one another of the first and second contact regions included in bit line selection circuits adjacent to one another of the bit line selection circuits.

10 Claims, 7 Drawing Sheets

(51) Int. Cl.
*H01L 27/108* (2006.01)
*G11C 29/04* (2006.01)

SEMICONDUCTOR DEVICE HAVING HIGH-VOLTAGE TRANSISTOR

CROSS-REFERENCE TO RELATED APPLICATION

This application is a Continuation in Part of U.S. patent application Ser. No. 13/602,887 filed on Sep. 4, 2012, which claims priority to and the benefit of Korean Patent Application No. 10-2011-0139986, filed on Dec. 22, 2011. The disclosure of each of the foregoing applications is incorporated herein by reference in its entirety.

BACKGROUND

The present invention relates to a semiconductor device, and more particularly, the present invention relates to a semiconductor device having a high-voltage transistor.

A semiconductor device may include a memory cell array including a plurality of memory cells configured to store data and a plurality of peripheral circuits configured to program or erase data into or from the memory cells or read out data stored in the memory cells.

The peripheral circuits may include a plurality of page buffers coupled to the memory cell array through bit lines. The page buffers may provide a program permission voltage or a program prohibition voltage through the bit lines in a program operation and receive states of cells through the bit lines in a read operation.

Meanwhile, interference may occur between adjacent bit lines as a degree of integration of a semiconductor device increases. Thus, in order to prevent the interference, the bit lines are classified into even-numbered bit lines and odd-numbered bit lines. The even-numbered bit lines may be called even bit lines, and the odd-numbered bit lines may be called odd bit lines. Since each of the page buffers is coupled to a bit line pair including an even bit line and an odd bit line, each of the page buffers may include a bit line selection circuit configured to select the even bit line or and the odd bit line of the bit line pair.

Figure 1:
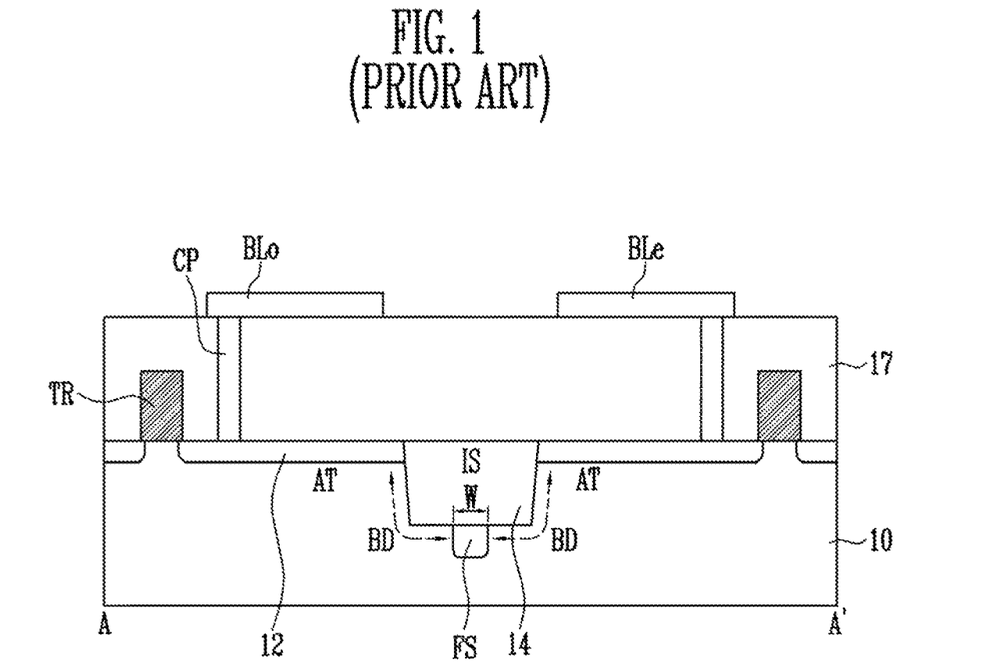
FIG. 1 illustrates a cross-sectional view of a conventional semiconductor device.

FIG. 1 is a cross-sectional view of a conventional semiconductor device. Referring to FIG. 1, an isolation region IS is formed to define active regions AT in a semiconductor substrate 10 and filled with an insulating material 14. Gate lines of transistors TR are formed on the active region AT in the semiconductor substrate 10, and junction regions 12 are formed in the semiconductor substrate 10 adjacent to both ends of each of the gate lines. Thus, the transistors TR including the gate lines and the junction regions 12 are formed. After that, an interlayer insulating layer 17 is formed to cover a resultant structure including the transistors TR, and contact plugs CP are formed on the junction regions 12 to penetrate the interlayer insulating layer 17. Each of bit lines BLo and BLe is formed over the interlayer insulating layer 17 to be coupled to each of the contact plugs CP.

When high-voltage transistors are formed in a selection circuit region and different voltages are applied to junction regions 12 formed in different active regions AT, depletion may occur in a region between the junction regions 12 in the different active regions AT. To prevent the occurrence of the depletion, an ion implantation process may be performed onto a portion of the semiconductor substrate 10 disposed under the isolation region IS, thereby forming a field stop ion implantation region FS. The field stop ion implantation region FS may be formed by implanting impurities having a different type from that of the junction region 12 formed in the active region AT. Accordingly, if a distance between the field stop ion implantation region FS and the junction region 12 is excessively reduced, a breakdown (BD) voltage may be lowered. To prevent this phenomenon from occurring, a minimum distance between the field stop ion implantation region FS and the junction region 12 should be secured. As a result, an area occupied by a semiconductor device may increase depending on a width W of the field stop ion implantation region FS and the minimum distance between the field stop ion implantation region FS and the junction region 12.

SUMMARY OF THE INVENTION

Embodiments of the present invention are directed to a semiconductor device having a high-voltage transistor. In this semiconductor device, to reduce the size of the semiconductor device, positions of an even bit line contact region and an odd bit line contact region are changed in a selection circuit block configured to select the even bit line or the odd bit line, such that a field stop region needs not be included in an isolation region.

One aspect of the present invention provides a semiconductor device including: a memory cell array including a plurality of memory cells connected to a first bit line and a second bit line, respectively, a page buffer group, and bit line selection circuits including a plurality of selection circuit blocks to connect the first bit lines or the second bit lines to the page buffer group, wherein each of the selection circuit blocks includes a first contact region and a second contact region to which the first and second bit lines coupled, and same bit lines of the first and second bit lines are coupled to contact regions adjacent to one another of the first and second contact regions included in bit line selection circuits adjacent to one another of the bit line selection circuits.

Another aspect of the present invention provides a semiconductor device including: a memory cell array including a plurality of memory cells connected to an even bit line and an odd bit line arranged in parallel, respectively, a page buffer group, and bit line selection circuits including a plurality of selection circuit blocks to connect the even bit line or the odd bit line to the page buffer group, wherein the selection circuit blocks include even bit line contact regions to which the even bit lines are connected and odd bit line contact regions to which the odd bit lines are connected, and the even bit line contact regions or the odd bit line contact regions included in the bit line selection circuits different one another are arranged to be adjacent to one another.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Embodiments of the present invention will be described with reference to the accompanying drawings. The present invention may, however, be embodied in different forms and should not be construed as limited to the embodiments set forth herein. Rather, the embodiments are provided so that this disclosure is thorough and complete and fully conveys the scope of the present invention to one skilled in the art.

Figure 2:
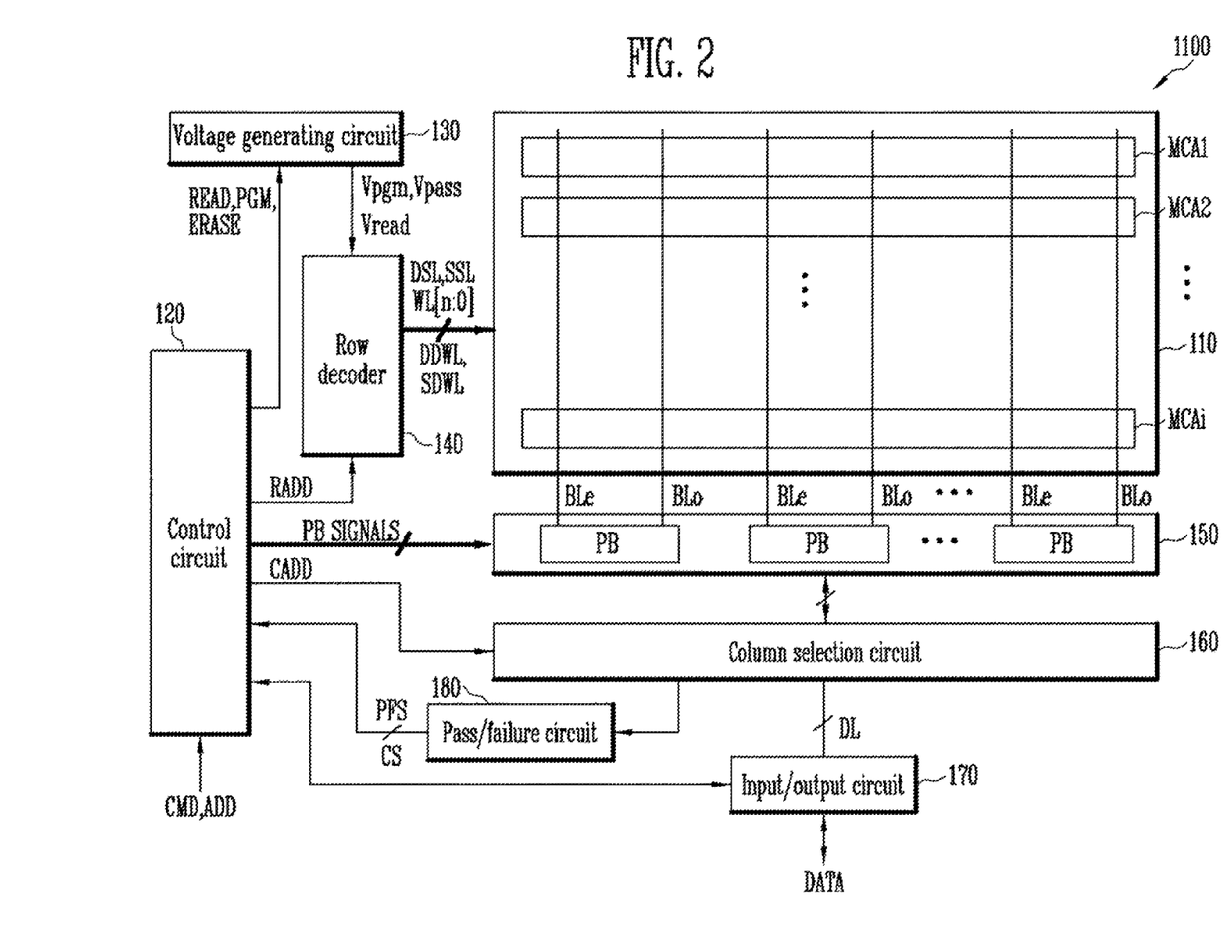
FIG. 2 illustrates a block diagram of a memory device according to an embodiment of the present invention.

FIG. 2 illustrates a block diagram of a semiconductor device according to an embodiment of the present invention.

Referring to FIG. 2, the semiconductor memory device includes a memory cell array 110, circuits 130, 140, 150, 160, 170, and 180 configured to perform a program operation, a read operation, or an erase operation on memory cells included in the memory cell array 110, and a control circuit 120 configured to control the circuits 130, 140, 150, 160, 170, and 180 to set threshold voltage levels of selected memory cells according to input data.

In case of the semiconductor memory device including a NAND flash memory device, the memory device may include a voltage generating circuit 130, a row decoder 140, a page buffer circuit 150, a column selection circuit 160, an input/output (I/O) circuit 170, and a pass/failure determining circuit 180.

The memory cell array 110 may include a plurality of cell blocks MCA1 to MCAi, and each cell block may include a plurality of memory cells in which data is stored. Even and odd bit lines BLe and BLo may be shared by the cell blocks MCA1 to MCAi. That is, the even bit lines BLe may be coupled not only to a first cell block MCA1 but also to the remaining cell blocks MCA2 to MCAi. Similarly, the odd bit lines BLo may be coupled not only to the first cell block MCA1 but also to the remaining cell blocks MCA2 to MCAi.

The control circuit 120 internally outputs a program operation signal PGM, a read operation signal READ, or an erase operation signal ERASE in response to a command signal CMD to the voltage generating circuit 130, and outputs page buffer signals PB SIGNALS to control a plurality of page buffers PB included in the page buffer circuit 150 in response to the command signal CMD. In addition, the control circuit 120 internally outputs a row address signal RADD and a column address signal CADD in response to an address signal ADD. Moreover, the control circuit 120 may confirm whether threshold voltages of selected memory cells are elevated to a target level or not in response to a counting signal CS output from the pass/failure determining circuit 180 during a program verification operation, and determine whether a program operation is to be re-performed or ended based on the confirmation result.

A voltage supply circuit may supply voltages required for programming, reading, or erasing memory cells to a drain selection line DSL, a drain dummy line DDWL, word lines WL0 to WLn, a source dummy line SDWL, and a source selection line SSL in response to the signals READ, PGM, ERASE, and RADD provided from the control circuit 120.

In accordance with an embodiment, the voltage supply circuit includes the voltage generating circuit 130 and the row decoder 140.

The voltage generating circuit 130 outputs operation voltages for programming, reading, or erasing memory cells to global lines in response to the operation signals PGM, READ, and ERASE, which are internal command signals. When the memory cells are to be programmed, the voltage generating circuit 130 outputs operation voltages, e.g., Vpgm, Vpass, and Vread, for the program operation to the global lines. In addition, when the memory cells are to be erased, the voltage generating circuit 130 applies a ground voltage to the word lines WL[n:0] or floats the word lines WL[n:0].

The row decoder 140 transmits the operation voltages Vpgm, Vpass, and Vread generated by the voltage generating circuit 130 to local lines DSL, WL[n:0], and SSL and dummy lines DDWL and SDWL of a selected cell block in response to the row address signals RADD from the control circuit 120.

The page buffer circuit 150 may include page buffers PB respectively coupled to the even and odd bit lines BLe and BLo. Each of the page buffers PB corresponds to a pair of bit lines, i.e., a bit line pair including even and odd bit lines BLe and BLo, and selects the even bit line BLe or the odd bit line BLo in response to the page buffer signals PB SIGNALS output from the control circuit 120. Specifically, during a program, read, or erase operation of memory cells, the page buffer circuit 150 precharges the even or odd bit lines BLe or BLo or latches data corresponding to detected threshold voltage levels of memory cells according to a voltage variation of the even or odd bit lines BLe or BLo. That is, in the program operation, the page buffer circuit 150 applies a program permission voltage, e.g., a ground voltage, or a program prohibition voltage, e.g., a power supply voltage, to bit lines according to input data. In the read operation, the page buffer circuit 150 receives voltages of the even and odd bit lines BLe and BLo according to output data read out of the memory cells to detect data stored in the memory cells.

The column selection circuit 160 selects a page buffer PB included in the page buffer circuit 150 in response to the column address signal CADD provided from the control circuit 120, and outputs data latched in the selected page buffer PB to a selected bit line.

The I/O circuit 170 transmits input data DATA to the column selection circuit 160 under the control of the control circuit 120 to input the input data DATA to each of the page buffers PB1 to PBj of the page buffer circuit 150. When the input data DATA is sequentially transmitted to the page buffers PB1 to PBj of the page buffer circuit 150, the page buffers PB1 to PBj store the input data DATA in internal latches. Furthermore, in the read operation, the I/O circuit 170 outputs the output data transmitted from the page buffers PB1 to PBj of the page buffer circuit 150 through the column selection circuit 160 to an external device.

The pass/failure determining circuit 180 checks if there are failed memory cells having threshold voltages lower than a target voltage level among programmed memory cells in a program verification operation performed after the program operation, and outputs a check signal PFS representing the checking results. If there are the failed memory cells, the pass/failure determining circuit 180 counts the number of the failed memory cells and outputs the counting results as a counting signal CS. The control circuit 120 controls the voltage generating circuit 130 to adjust a level of a program voltage applied to a selected word line during the program operation and to selectively apply verification voltages to a selected word line during the program verification operation. In this case, the control circuit 120 controls the voltage generating circuit 130 in response to the counting signal CS provided from the pass/failure determining circuit 180.

Figure 3:
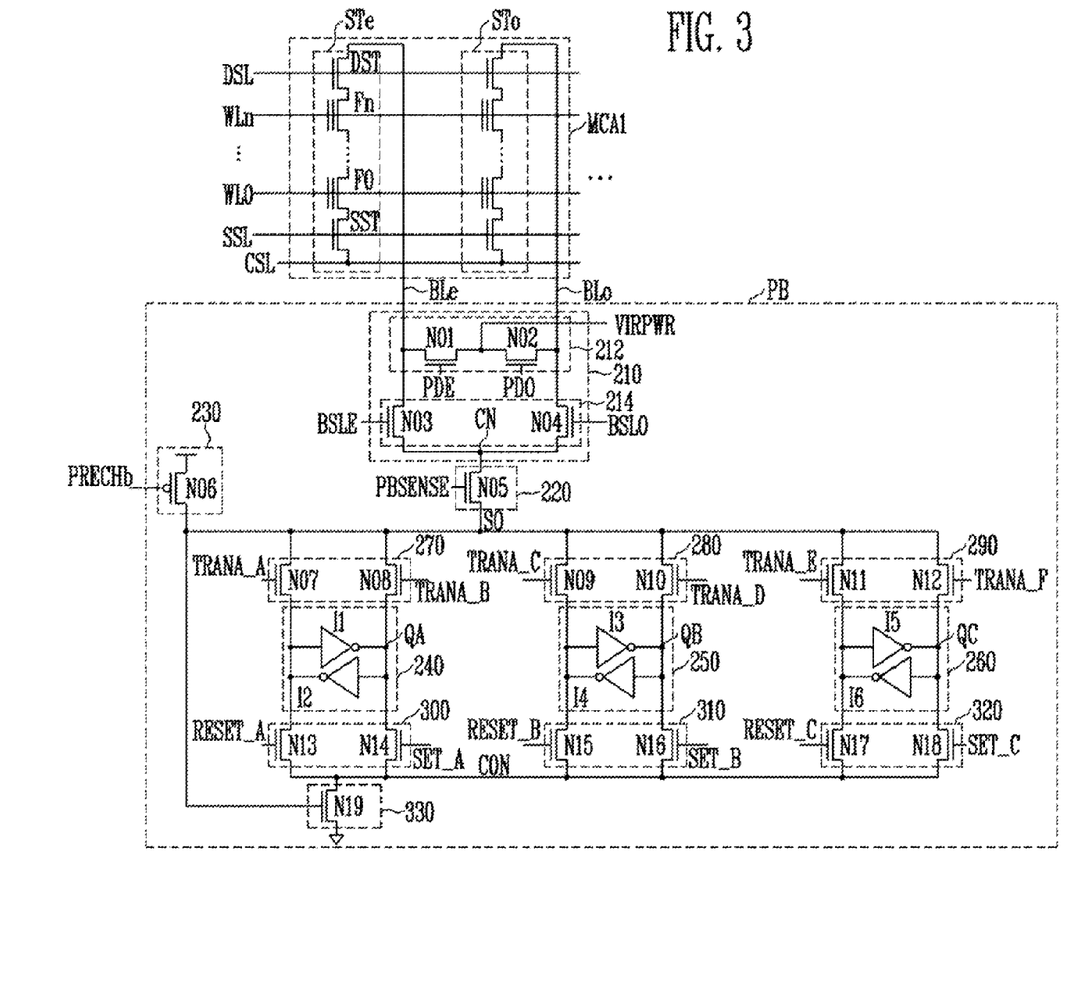
FIG. 3 illustrates a detailed circuit diagram of a cell block and a page buffer shown in FIG. 1.

FIG. 3 illustrates a detailed circuit diagram of a cell block MCA and a page buffer PB shown in FIG. 1.

Referring to FIG. 3, only the first cell block MCA1 and one page buffer PB corresponding thereto are illustrated for convenience of description. Since the page buffer PB transmits a high voltage, a high-voltage transistor may be used as a switch transistor, which will be described in detail hereinafter.

The page buffer PB includes a bit line selection circuit 210 configured to select an even bit line BLe or an odd bit line BLo, a sensing circuit 220 configured to transmit a voltage of the selected bit line to a sensing node SO in a read operation, a precharge circuit 230 configured to precharge the sensing node SO, a first latch 240, a second latch 250, and a third latch 260 configured to latch data, a first transmission circuit 270 configured to transmit data stored in the first latch 240 to the sensing node SO, a second transmission circuit 280 configured to transmit data stored in the second latch 250 to the sensing node SO, a third transmission circuit 290 configured to transmit data stored in the third latch 260 to the sensing node SO, a first set/reset circuit 300 configured to set up or reset the first latch 240, a second set/reset circuit 310 configured to set up or reset the second latch 250, a third set/reset circuit 320 configured to set up or reset the third latch 260, and a discharge circuit 330 configured to discharge a common node CON of the first to third set/rest circuits 300, 310, and 320.

The bit line selection circuit 210 includes a bit line precharge circuit 212 configured to precharge the even bit line BLe or the odd bit line BLo during a program operation and a selection circuit block 214 configured to select the even bit line BLe or the odd bit line BLo.

The bit line precharge circuit 212 includes a first switch N01 configured to precharge the even bit line BLe in response to an even precharge signal PDE and a second switch N02 configured to precharge the odd bit line BLo in response to an odd precharge signal PDO. The first switch N01 may include an NMOS transistor coupled to and disposed between the even bit line BLe and a virtual power terminal to which a virtual power VIRPWR is applied, and the second switch N02 may include an NMOS transistor coupled to and disposed between the odd bit line BLo and the virtual power terminal.

The selection circuit block 214 includes a third switch N03 configured to select the even bit line BLe in response to an even selection signal BSLE and a fourth switch N04 configured to select the odd bit line BLo in response to an odd selection signal BSLO. The third switch N03 is coupled to and disposed between the even bit line BLe and a node CN, and the fourth switch N04 is coupled to and disposed between the odd bit line BLo and the node CN. Each of the third and fourth switches N03 and N04 may include an NMOS transistor.

The sensing circuit 220 may include a fifth switch N05 configured to couple a selected bit line and the sensing node SO in response to a sensing signal PBSENSE. The fifth switch N05 may include an NMOS transistor coupled to and disposed between the node CN and the sensing node SO.

The precharge circuit 230 includes a sixth switch N06 configured to couple a power supply terminal to which a power supply voltage VDD is applied and the sensing node SO to precharge the sensing node SO with the power supply voltage VDD in response to a precharge signal PRECHb. The sixth switch N06 may include a PMOS transistor.

The first latch 240 includes first and second inverters I1 and I2. An output terminal of the first inverter I1 is connected to an input terminal of the second inverter I2, and an output terminal of the second inverter I2 is connected to an input terminal of the first inverter I1. Data QA stored in the first latch 240 is determined by a voltage level at the output terminal of the first inverter I1. For example, if the output terminal of the first inverter I1 has a high voltage level, the data DQ stored in the first latch 240 may be set to a logical value '1.' On the other hand, if the output terminal of the first inverter I1 has a low voltage level, the data QA stored in the first latch 240 may be set to a logical value '0.'

The second latch 250 includes third and fourth inverters I3 and I4. An output terminal of the third inverter I3 is connected to an input terminal of the fourth inverter I4, and an output terminal of the fourth inverter I4 is connected to an input terminal of the third inverter I3. Data QB stored in the second latch 250 is determined by a voltage level at the output terminal of the third inverter I3. For instance, if the output terminal of the third inverter I3 has a high voltage level, the data QB stored in the second latch 250 may be se to a logical value '1.' On the other hand, if the output terminal of the third inverter I3 has a low voltage level, the data QB stored in the second latch 250 may be set to a logical value '0.'

Figure 4:
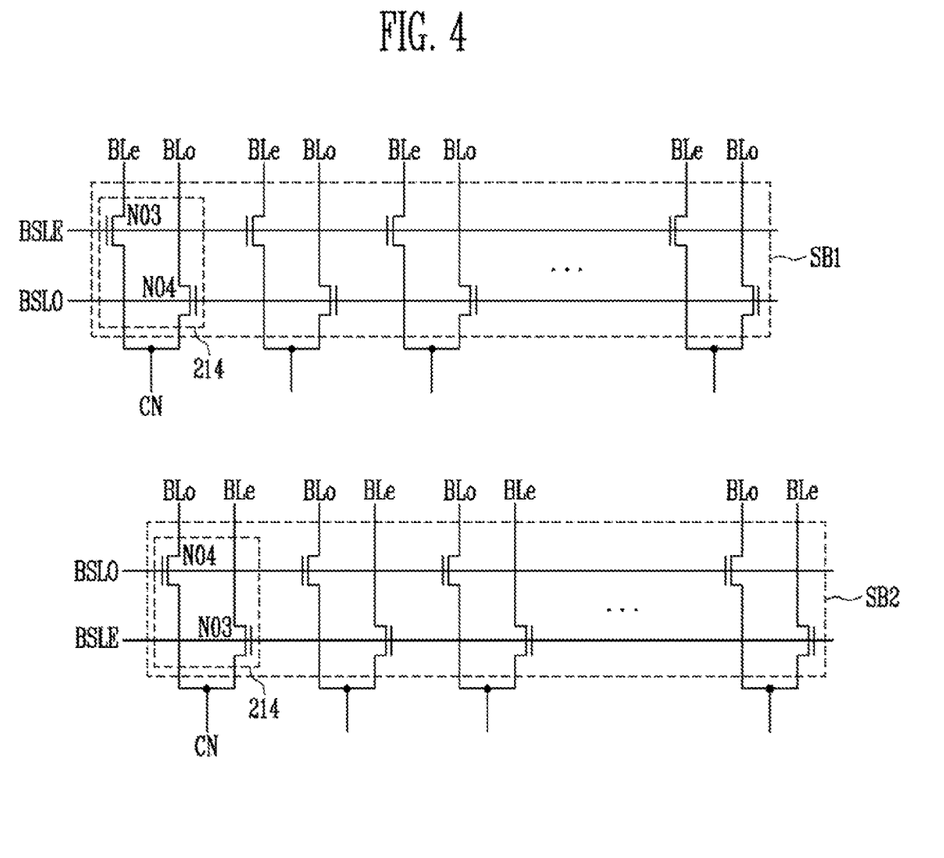
FIG. 4 illustrates a circuit diagram of a selection circuit shown in FIG. 3.

The third latch 260 includes fifth and sixth inverters I5 and I6. An output terminal of the fifth inverter I5 is connected to an input terminal of the sixth inverter I6, and an output terminal of the sixth inverter I6 is connected to an input terminal of the fifth inverter I5. Data QC stored in the third latch 260 is determined by a voltage level at the output terminal of the fifth inverter I5. For example, if the output terminal of the fifth inverter I5 has a high voltage level, the data QC stored in the third latch 260 may be set to a logical value '1.' On the other hand, if the output terminal of the fifth inverter I5 has a low voltage level, the data QC stored in the third latch 260 may be set to a logical value '0.' Although FIG. 4 shows the page buffer PB including only three latches 240 to 260, a larger number of latches may be included in the page buffer PB.

The first transmission circuit 270 includes a seventh switch N07 configured to couple the input terminal of the first inverter I1 to the sensing node SO in response to a first transmission signal TRANA_A and an eighth switch N08 configured to couple the output terminal of the first inverter I1 to the sensing node SO in response to a second transmission signal TRANA_B. Each of the seventh and eighth switches N07 and N08 may include an NMOS transistor.

The second transmission circuit 280 includes a ninth switch N09 configured to couple the input terminal of the third inverter I3 to the sensing node SO in response to a third transmission signal TRANA_C and a tenth switch N10 configured to couple the output terminal of the third inverter I3 to the sensing node SO in response to a fourth transmission signal TRANA_D. Each of the ninth and tenth switches N09 and N10 may include an NMOS transistor.

The third transmission circuit 290 includes an eleventh switch N11 configured to couple the input terminal of the fifth inverter I5 to the sensing node SO in response to a fifth transmission signal TRANA_E and a twelfth switch N12 configured to couple the output terminal of the fifth inverter I5 to the sensing node SO in response to a sixth transmission signal TRANA_F. Each of the eleventh and twelfth switches N11 and N12 may include an NMOS transistor.

The first set/reset circuit 300 includes a thirteenth switch N13 and a fourteenth switch N14. The thirteenth switch N13 couples the output terminal of the second inverter I2 to the common node CON and resets the first latch 240 in response to a first reset signal RESET_A. The fourteenth switch N14 couples the input terminal of the second inverter I2 to the common node CON and sets up the first latch 240 in response to a first set signal SET_A. Each of the thirteenth and fourteenth switches N13 and N14 may include an NMOS transistor.

The second set/reset circuit 310 includes a fifteenth switch N15 and a sixteenth switch N16. The fifteenth switch N15 couples the output terminal of the fourth inverter I4 to the common node CON and resets the second latch 250 in response to a second reset signal RESET_B. The sixteenth switch N16 couples the input terminal of the fourth inverter I4 to the common node CON and sets up the second latch 250 in response to a second set signal SET_B. Each of the fifteenth and sixteenth switches N15 and N16 may include an NMOS transistor.

The third set/reset circuit 320 includes a seventeenth switch N17 and an eighteenth switch N18. The seventeenth switch N17 couples the output terminal of the sixth inverter I6 to the common node CON and resets the third latch 260 in response to a third reset signal RESET_C. The eighteenth switch N18 couples the input terminal of the sixth inverter I6 to the common node CON and sets up the third latch 260 in response to a third set signal SET_C. Each of the seventeenth and eighteenth switches N17 and N18 may include an NMOS transistor.

The discharge circuit 330 includes a nineteenth switch N19 configured to couple the common node CON to a ground voltage terminal Vss and discharge the common node CON in response to a signal of the sensing node SO. The nineteenth switch N19 may include an NMOS transistor.

FIG. 4 illustrates a circuit diagram of the selection circuit 214 in FIG. 3.

Referring to FIG. 4, the number of selection circuit blocks 214 corresponds to the number of page buffers PB. Each of the selection circuit blocks 214 includes switch transistors N03 and N04 coupled to and disposed between a pair of even and odd bit lines BLe and BLo and a node CN. The page buffers PB may be included in a page buffer group. Among transistors included in the selection circuit blocks 214, gates of the transistors N03 coupled to the even bit lines BLe are coupled to a gate line to which an even selection signal BSLE is applied, and gates of the transistors N04 coupled to the odd bit lines BLo are coupled to a gate line to which an odd selection signal BSLO is applied. Accordingly, if the even selection signal BSLE is enabled, all the even bit lines BLe are coupled to the node CN. On the other hand, if the odd selection signal BSLO is enabled, all the odd bit lines BLo are coupled to the node CN.

The selection circuit blocks 214 may be grouped in a plurality of bit line selection circuits SB1 and SB2 in accordance with an arranged location. For example, the selection circuit 214s may be arranged in a first direction and a second direction perpendicular to the first direction. The selection circuit blocks 214 arranged in the second selection may be included in one group, and the selection circuit blocks 214 arranged in the first direction may be included in different groups. When the bit line selection circuits SB1 and SB2 include a first bit line selection circuit SB1 and a second bit line selection circuit SB2, the first bit line selection circuit SB1 and the second bit line selection circuit SB2 may be arranged in the first direction.

The selection circuit blocks 214 included in the first bit line selection circuit SB1 and the selection circuit blocks 214 included in the second bit line selection circuit SB2 may be arranged not to be symmetrical with each other. That is, the selection circuit blocks 214 included in the first bit line selection circuit SB1 and the selection circuit blocks 214 included in the second bit line selection circuit SB2 may be arranged in the first direction but to be crossed each other. For example, the selection circuit blocks 214 included in the second selection circuit block SB2 may be arranged in the first direction between the selection circuit blocks 214 included in the first bit line selection circuit SB1. Thus, a gate to which the odd selection signal BSLO of the first bit line selection circuit SB1 is applied and a gate to which the odd selection signal BSLO of the second bit line selection circuit SB2 is applied may be adjacent to each other. In other words, gates to which the odd selection signal BSLO is applied may be arranged between a gate to which the even selection signal BSLE of the first bit line selection circuit SB1 is applied to and a gate to which an even selection signal BSLE of the second bit line selection circuit SB2 are applied.

In FIG. 4, the gates to which the odd selection signal BSLO is applied may be arranged between the gates to which the even selection signal BSLE is applied. However, depending on a memory device, the gates may be arranged the other way around. For example, the gates to which the even selection signal BSLE is applied may be arranged between the gates to which the odd selection signal BSLO is applied. Although not shown in FIG. 3, when a third selection circuit block is designated to be arranged along the first direction from the second selection circuit block SB2, the gates to which the even selection signal BSLE is applied may be arranged between the gates to which the odd selection signal BSLO is applied in the second selection circuit block SB2 and the third selection circuit block. The layout of the above-described selection circuit will be described hereinafter with reference to FIG. 5.

Figure 5:
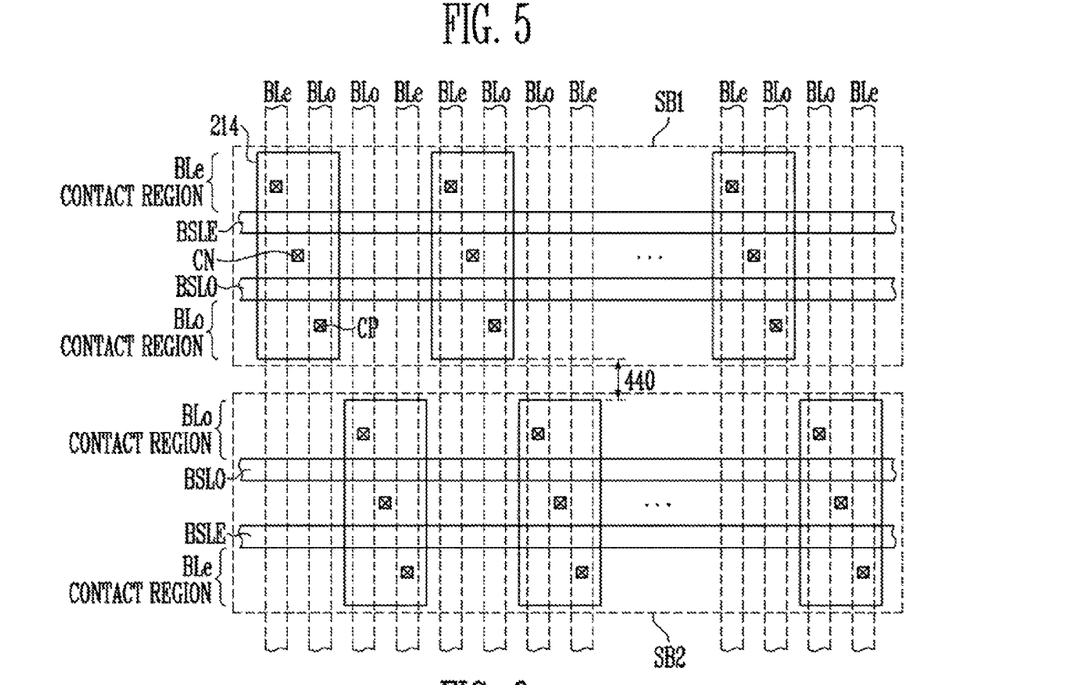
FIG. 5 illustrates the layout of a selection circuit according to an embodiment of the present invention.

FIG. 5 illustrates the layout of a selection circuit according to an embodiment of the present invention.

Referring to FIG. 5, since a very large number of bit lines BLe and BLo are included in a semiconductor device, a plurality of selection circuits may also be included. Accordingly, since a very long layout region is required to arrange the selection circuits in a second direction, a plurality of bit line selection circuits SB1 and SB2 arranged in a first direction perpendicular to the second direction may be provided, and a plurality of selection circuits may be included in each of the bit line selection circuit SB1 to SBk. The selection circuit 214 may be formed of active regions spaced apart from each other, and device isolation regions may be formed between the active regions. A plurality of even and odd bit lines BLe and BLo may be arranged in each of the bit line selection circuit SB1 and SB2.

The even bit lines BLe may be connected to the selection circuit blocks 214 through contact plugs CP of a contact region of the even bit lines BLe and the odd bit lines BLo may be connected to the selection circuit blocks 214 through contact plugs CP of a contact region of the odd bit lines BLo.

Pairs of bit lines including the even bit lines BLe and the odd bit lines BLo may be coupled to the selection circuit blocks SB1 and SB2, respectively, and the even bit lines BLe and the odd bit lines BLo included in pairs of bit lines adjacent to one another, among the pairs of bit lines may be arranged to be symmetrical to each other.

As such, when bit line contact regions same as one another are arranged to be opposite one another, a depletion may not occur between the selection circuit blocks different from one another. Therefore, a field stop ion implantation region may not be formed in an isolation region disposed between the two adjacent selection circuit blocks.

Figure 6:
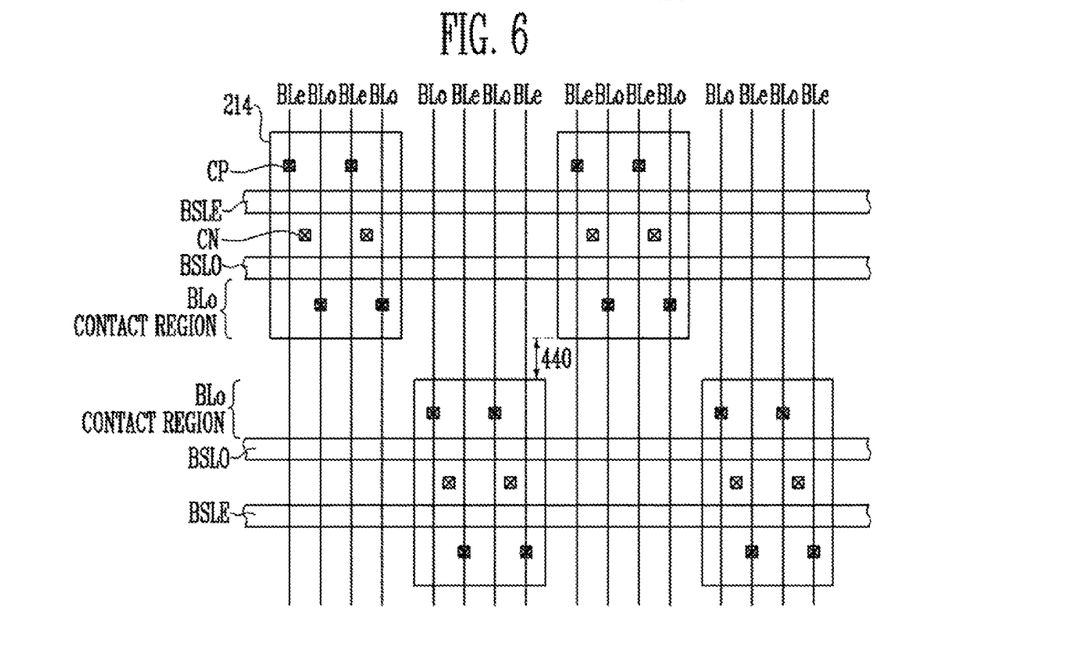
FIG. 6 illustrates the layout of a selection circuit according to an embodiment of the present invention.

FIG. 6 is a block view illustrating a layout of a selection circuit according to an embodiment of the present disclosure.

Referring to FIG. 6, in each of the selection circuit blocks 214, a plurality of contact plugs CP may be formed in a same bit line contact region. As an example of one selection circuit 214, the contact region of the even bit line BLe and the contact region of the odd bit line BLo may be included in the selection circuit 214. A plurality of contact plugs CP connected to the even bit lines BLe may be included in the contact region of the even bit line BLe, and a plurality of contact plugs CP connected to the odd bit lines BLo may be included in the contact region of the odd bit line BLo. The contact plug connected to a node CN of the page buffer may be formed between the contact region of the even bit line BLe and the contact region of the odd bit line BLo. Different even bit lines BLe may be connected to the contact plugs CP formed in the contact region of the even bit line BLe of a same selection circuit 214, and different odd bit line BLo may be connected to the contact plugs CP formed in the contact region of the odd bit line BLo. In an embodiment shown in FIG. 6, because the bit line contact regions same as one another are arranged to be adjacent to one another, an occurrence of the depletion among the different selection circuit blocks may be prevented. Due to the above, the number of processes may be reduced because an ion inserting process for forming a field stop zone in a device isolation region 440, and an area of a memory device may be reduced since a field stop ion inserting region is not formed.

Figure 7:
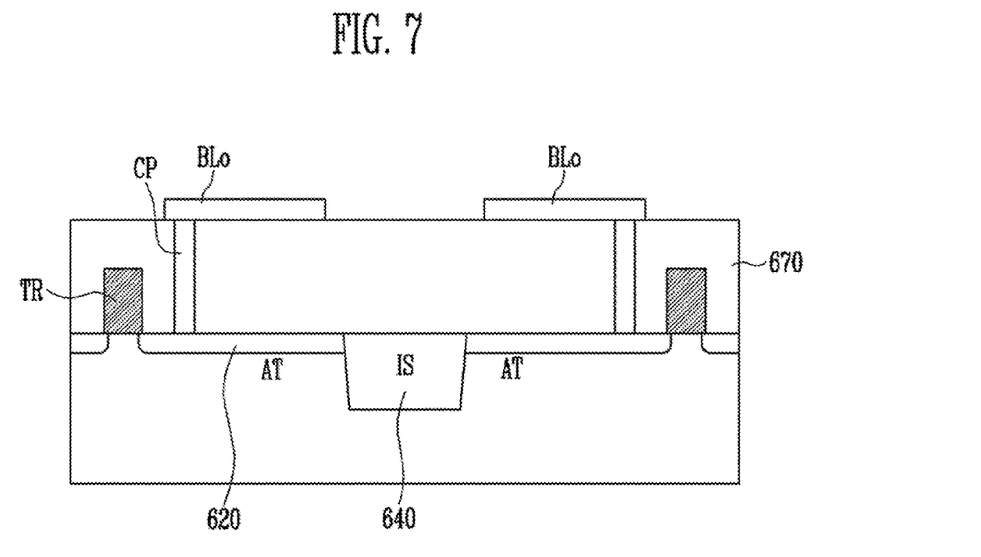
FIG. 7 illustrates a cross-sectional view of a semiconductor device according to an embodiment of the present invention.

FIG. 7 illustrates a cross-sectional view of a semiconductor device according to an embodiment of the present invention.

Referring to FIG. 7, sine a field stop region is not formed in the isolation region IS, an area occupied by a conventional field stop region in the isolation region IS may be reduced. For example, when a first voltage is applied to the odd bit lines BLo, since the same first voltage is applied to the opposite odd bit lines BLo, depletion may not occur in the semiconductor substrate under the isolation region IS. As a result, an area of a semiconductor substrate may be reduced by omitting a field stop region, and the number of process steps may be reduced by omitting an ion implantation process for forming the field stop region.

According to the present invention as described above, bit line groups of the same type (e.g., odd bit line groups or even bit line groups) are arranged parallel to one another across an isolation region. As a result, even if a depletion cut-off region is not formed, not only depletion but also a drop in breakdown voltage can be inhibited in a semiconductor substrate disposed under an isolation region, and a semiconductor device can be downscaled.

Figure 8:
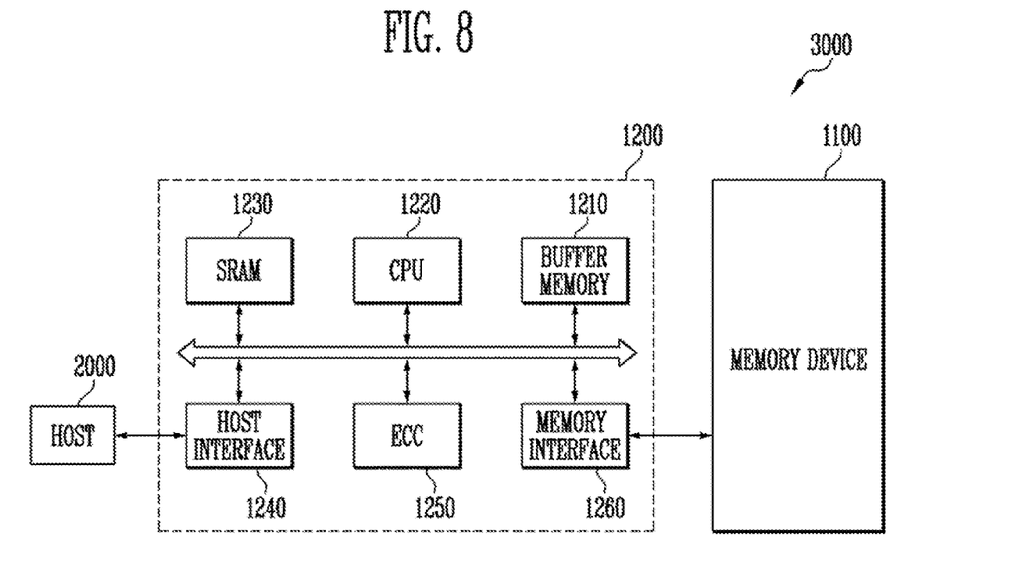
FIG. 8 is a diagram illustrating an example of a memory system according to an embodiment of the present disclosure.

FIG. 8 is a diagram illustrating an example of a memory system according to an embodiment of the present disclosure.

Referring to FIG. 8, a memory system 3000 may include a memory device 1100 for storing data and a controller 1200 for controlling the memory device 1100. Further, the controller 1200 may control communications between a host 2000 and the memory device 1100. The controller 1200 may include a buffer memory 1210, a Central Processing Unit (CPU) 1220, a Static Random Access Memory (SRAM) 1230, a host interface 1240, an Error Correction Code (ECC) unit 1250, and a memory interface 1260.

The buffer memory 1210 temporarily stores data while the controller 1200 controls the memory device 1100. The CPU 1220 may perform a control operation for data exchange in the controller 1200. The SRAM 1230 may be used as the working memory of the CPU 1220. The host interface 1240 may have a data exchange protocol for the host 2000 connected to the memory system 3000. The ECC unit 1250 is an error correction unit, which may detect and correct errors contained in data read from the memory device 1100. The memory interface 1260 may interface with the memory device 1110. Although not illustrated in FIG. 8, the memory system 3000 may further include a Read Only Memory (ROM) for storing code data for interfacing with the host 2000.

The host 2000 in which the memory system 3000 according to an embodiment of the present disclosure may be used may include a computer, an Ultra Mobile PC (UMPC), a workstation, a net-book, a Personal Digital Assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving information in a wireless environment, and various devices constituting a home network.

Figure 9:
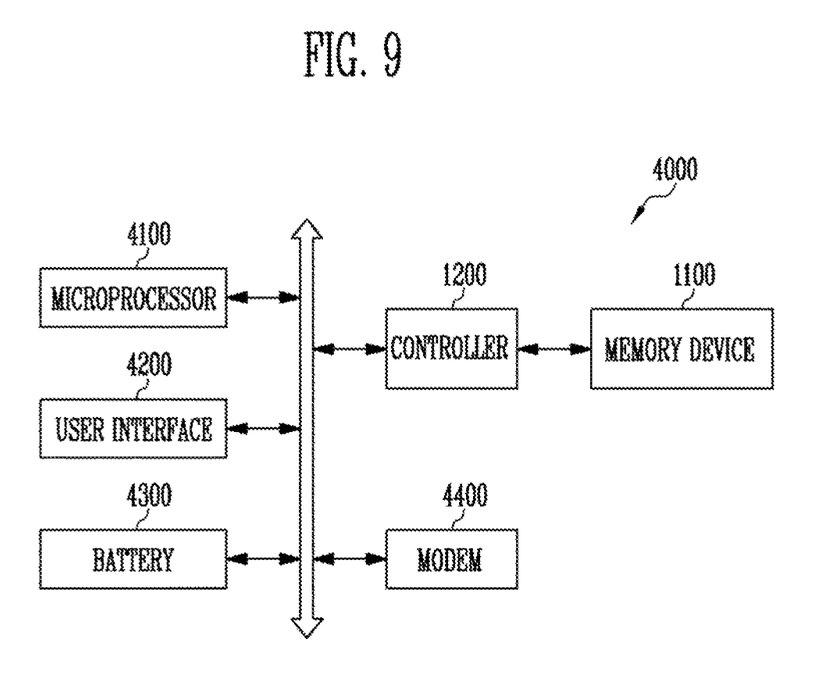
FIG. 9 is a diagram illustrating an example of a computing system including a memory system according to an embodiment of the present disclosure.

FIG. 9 is a diagram illustrating an example of a computing system including a memory system according to an embodiment of the present disclosure.

Referring to FIG. 9, a memory system 4000 according to an embodiment of the present disclosure may include a memory device 1110, a controller 1200, a microprocessor 4100, a user interface 4200, and a modem 4400, which are electrically connected to a bus. Further, when the memory system 4000 according to an embodiment of the present disclosure is a mobile device, a battery 4300 for supplying the operating voltage of the memory system 4000 may be further included. Although not illustrated in the drawing, the memory system 4000 according to the present disclosure may further include an application chip set, a Camera Image Processor (CIS), a mobile DRAM, etc. The controller 1200 and the memory device 1110 may constitute a Solid State Drive/Disk (SSD).

The memory system 4000 according to an embodiment of the present disclosure may be made using various types of packages. For example, the memory system 4000 according to an embodiment of the present disclosure may be made using packages, such as a Package on Package (PoP), a Ball grid array (BGA), a Chip Scale package (CSP), a Plastic Leaded Chip Carrier (PLCC), a Plastic Dual In-Line Package (PDIP), a Die in Waffle pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a System In Package (SIP), a Multi Chip Package (MCP), a Wafer-level Fabricated Package (WFP), and a Wafer-Level Processed Stack Package (WSP).

Various embodiments of the present disclosure may improve the reliability of a read operation of a memory device, and also improve the reliability of a memory system including the memory device.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device, comprising:
a memory cell array including a plurality of memory cells connected to a first bit line and a second bit line, respectively;
a page buffer group; and
bit line selection circuits including a plurality of selection circuit blocks to connect the first bit lines or the second bit lines to the page buffer group,
wherein each of the selection circuit blocks includes a first contact region and a second contact region to which the first and second bit lines coupled, and same bit lines of the first and second bit lines are coupled to contact regions adjacent to one another of the first and second contact regions included in bit line selection circuits adjacent to one another of the bit line selection circuits.

2. The semiconductor device of claim 1, wherein when the bit line selection circuits include a first bit line selection circuit and a second bit line selection circuit, the first bit line selection circuit is arranged between the memory cell array and the second bit line selection circuit.

3. The semiconductor device of claim 2, the first contact regions included in the selection circuit blocks of the first bit line selection circuit are arranged to be adjacent to the first contact regions included in the selection circuit blocks of the second bit line selection circuit.

4. The semiconductor device of claim 1, the first and second bit lines are arranged in parallel and connected to the memory cells and the first and second contact regions.

5. The semiconductor device of claim 1, wherein the memory cell array, the bit line selection circuits and the page buffer group are arranged in a first direction, and
the first and second bit lines extending in the first direction are arranged in parallel in a second direction perpendicular to the first direction.

6. The semiconductor device of claim 5, wherein the selection circuit blocks included in a same bit line selection circuit, among the bit line selection circuits are arranged in the second direction.

7. The semiconductor device of claim 1, wherein pairs of bit lines including the first and second bit lines are coupled to the selection circuit blocks, respectively, and
first and second bit lines included in pairs of bit lines adjacent to one another, among the pairs of bit lines are arranged to be symmetrical to each other.

8. The semiconductor device of claim 1, wherein bit line groups including a plurality of first and second bit lines are coupled to the selection circuit blocks, respectively, and the plurality of first and second bit lines included in bit line groups adjacent to one another, among the bit line groups are arranged to be symmetrical to each other.

9. A semiconductor device, comprising:
a memory cell array including a plurality of memory cells connected to an even bit line and an odd bit line arranged in parallel, respectively;
a page buffer group; and
bit line selection circuits including a plurality of selection circuit blocks to connect the even bit line or the odd bit line to the page buffer group, wherein the selection circuit blocks include even bit line contact regions to which the even bit lines are connected and odd bit line contact regions to which the odd bit lines are connected, and the even bit line contact regions or the odd bit line contact regions included in the bit line selection circuits different one another are arranged to be adjacent to one another.

10. The semiconductor device of claim 9, wherein the selection circuit blocks included in each of the bit line selection circuits same as one another are arranged in a direction same as one another, and
the selection circuit blocks included in the bit line selection circuits different from one another are arranged so that the even bit line contact regions or the odd bit line contact regions are opposite to one another.

* * * * *